US012690374B2

(12) United States Patent　　　　(10) Patent No.:　US 12,690,374 B2

Tu et al.　　　　　　　　　　　　　(45) Date of Patent:　　　Jul. 21, 2026

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Qing Tu, Wuhan (CN); Xue Zhou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 448 days.

(21) Appl. No.: 18/288,915

(22) PCT Filed: Jun. 29, 2023

(86) PCT No.: PCT/CN2023/103701
　§ 371 (c)(1),
　(2) Date: Oct. 30, 2023

(87) PCT Pub. No.: WO2024/109046
　PCT Pub. Date: May 30, 2024

(65) Prior Publication Data
　US 2024/0172535 A1　　May 23, 2024

(30) Foreign Application Priority Data
　Nov. 22, 2022　(CN) ......................... 202211468808.3

(51) Int. Cl.
　*H10K 59/80*　　　　(2023.01)
　*H10K 59/122*　　　(2023.01)
　　　　　　(Continued)

(52) U.S. Cl.
　CPC ......... *H10K 59/878* (2023.02); *H10K 59/122* (2023.02); *H10K 59/131* (2023.02); *H10K 59/352* (2023.02)

(58) Field of Classification Search
　CPC .. H10K 59/878; H10K 59/131; H10K 59/122; H10K 59/352
　See application file for complete search history.

(56) References Cited

U.S. PATENT DOCUMENTS

| | | | |
|---|---|---|---|
| 2008/0024402 A1* | 1/2008 | Nishikawa ....... | H10K 59/80515 345/82 |
| 2012/0001186 A1 | 1/2012 | Kondoh et al. | |

(Continued)

FOREIGN PATENT DOCUMENTS

| | | |
|---|---|---|
| CN | 1947464 A | 4/2007 |
| CN | 102405687 A | 4/2012 |

(Continued)

OTHER PUBLICATIONS

Chinese Office Action issued in corresponding Chinese Patent Application No. 202211468808.3 dated Apr. 18, 2025, pp. 1-8, 17pp.

(Continued)

*Primary Examiner* — Anne M Hines
(74) *Attorney, Agent, or Firm* — The Roy Gross Law Firm, LLC; Roy D. Gross

(57)　　　　　ABSTRACT

An embodiment of the present application discloses a display panel and a mobile terminal, wherein a concave structure having a reflective sidewall is provided on each anode, an area of a first anode is greater than an area of a second anode, and the area of the second anode is greater than an area of a third anode. A ratio of an area of the concave structure on the first anode to the area of the first anode is less than a ratio of an area of the concave structure on the second anode to the area of the second anode, and is less (Continued)

than a ratio of an area of the concave structure on the third anode to the area of the third anode.

20 Claims, 4 Drawing Sheets

(51) Int. Cl.
    *H10K 59/131*       (2023.01)
    *H10K 59/35*        (2023.01)

(56)          References Cited

U.S. PATENT DOCUMENTS

| | | | | |
|---|---|---|---|---|
| 2014/0306241 A1* | 10/2014 | Hirakata | ................ | H10K 59/38 |
| | | | | 257/79 |
| 2014/0346449 A1* | 11/2014 | Choi | .................... | H10K 59/877 |
| | | | | 438/23 |
| 2017/0092705 A1* | 3/2017 | Lim | ..................... | H10K 50/813 |

FOREIGN PATENT DOCUMENTS

| | | | |
|---|---|---|---|
| CN | 105226080 A | 1/2016 |
| CN | 106935621 A | 7/2017 |
| CN | 107006096 A | 8/2017 |
| CN | 109585672 A | 4/2019 |
| CN | 110071120 A | 7/2019 |
| CN | 111106258 A | 5/2020 |
| CN | 111987124 A | 11/2020 |
| CN | 112542488 A | 3/2021 |
| CN | 112652646 A | 4/2021 |
| CN | 113380862 A | 9/2021 |
| CN | 113629109 A | 11/2021 |
| CN | 114256434 A | 3/2022 |
| CN | 114784075 A | 7/2022 |
| CN | 115241236 A | 10/2022 |
| CN | 115942772 A | 4/2023 |
| JP | 2015090810 A | 5/2015 |
| KR | 20170052467 A | 5/2017 |
| KR | 20170123569 A | 11/2017 |
| KR | 20210034194 A | 3/2021 |
| KR | 20210130121 A | 10/2021 |

OTHER PUBLICATIONS

Korean Office Action issued in corresponding Japanese Patent Application No. 10-2023-7041285 dated Dec. 14, 2024, pp. 1-9, 16pp.
PCT International Search Report for International Application No. PCT/CN2023/103701, mailed on Jul. 24, 2023, 12pp.
PCT Written Opinion of the International Searching Authority for International Application No. PCT/CN2023/103701, mailed on Jul. 24, 2023, 9pp.

* cited by examiner

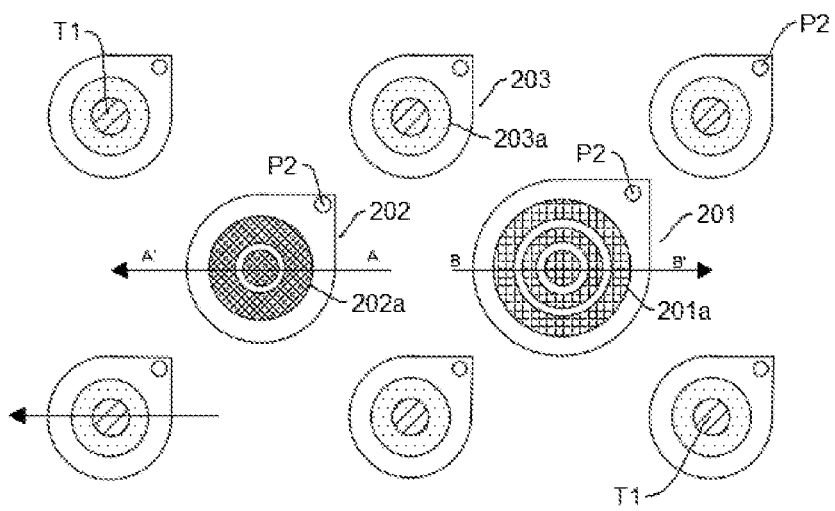
FIG. 7
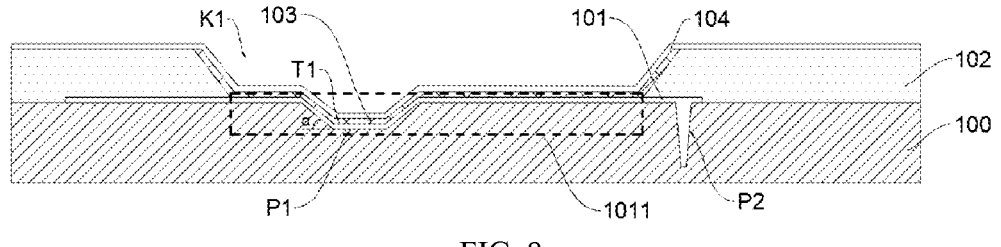
FIG. 8
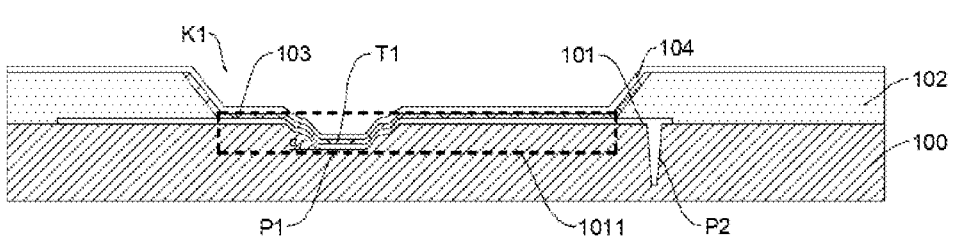
FIG. 9
FIG. 10

DISPLAY PANEL AND MOBILE TERMINAL

CROSS REFERENCE TO RELATED APPLICATIONS

This application is a National Phase of PCT Patent Application No. PCT/CN2023/103701 having International filing date of Jun. 29, 2023, which claims the benefit of priority of Chinese Patent Application No. 202211468808.3, filed Nov. 22, 2022, the contents of which are all incorporated herein by reference in their entirety.

TECHNICAL FIELD

The present application relates to the field of display, and more particularly, to a display panel and a mobile terminal.

BACKGROUND

Currently, organic electroluminescence displays (OLED) occupy mainstream market of cell phone panels in small size. Compared with a conventional liquid crystal display emitting lights from a backlight, an OLED panel emits lights actively by organic electroluminescent material, and each pixel corresponds to a thin film transistor switch, which is a current-driven display. A terminal of a display screen, such as a mobile phone, a laptop, and a car display, consumes increasingly on power of the screen. Therefore, manufactures provide a number of new low-power technologies for panels, such as low temperature polycrystalline oxide (LTPO) and pol-less. However, at present, most of these technologies reduce power consumption in the thin film transistor (TFT) processing or the module processing, and light-emitting efficiency of the OLED is not improved.

Therefore, there is a need for a display panel that has high and balanced light-emitting efficiency, has high stability of light-emitting devices, and has long service life.

Technical Solution

An embodiment of the present application provides a display panel and a mobile terminal, which can effectively improve the light-emitting efficiency of the display panel and balance emitted lights. The display panel has a low power consumption, high stability, and long service life.

The present application provides a display panel including:

a base layer; and a light-emitting device layer disposed on the base layer, wherein the light-emitting device layer includes a plurality of first color light-emitting devices, a plurality of second color light-emitting devices, and a plurality of third color light-emitting devices; wherein the light-emitting device layer further includes an anode layer, a pixel definition layer, a light-emitting layer, and a cathode; wherein the anode layer includes a plurality of anodes, the pixel definition layer is provided with a pixel opening corresponding to each of the plurality of anodes, the light-emitting layer is provided in the pixel opening and connected to the anode, and the cathode is provided on the light-emitting layer;

wherein the plurality of anodes include a plurality of first anodes corresponding to the first color light-emitting devices, a plurality of second anodes corresponding to the second color light-emitting devices, and a plurality of third anodes corresponding to the third color light-emitting devices; wherein at least one of the first anodes, one of the second anodes, and one of the third anodes have a concave structure in the pixel opening; and the concave structure includes a reflective sidewall having a slope;

wherein an area of each of the first anodes is greater than an area of each of the second anodes, and the area of the second anode is greater than an area of each of the third anodes;

wherein a ratio of an area of the concave structure on the first anode to the area of the first anode is less than a ratio of an area of the concave structure on the second anode to the area of the second anode; and a ratio of an area of the concave structure on the second anode to the area of the second anode is less than a ratio of an area of the concave structure on the third anode to the area of the third anode.

In an embodiment of the present application, a total area of concave structures on the first anode is greater than a total area of concave structures on the second anode, and a total area of concave structures on the second anode is greater than a total area of concave structure on the third anode.

In an embodiment of the present application, the concave structure includes a bottom surface, the reflective sidewall is connected to an edge of the bottom surface, and an acute angle $\alpha$ between the reflective sidewall and the bottom surface satisfies: $10° \leq \alpha \leq 80°$.

In an embodiment of the present application, the base layer is provided with a receiving groove, the concave structure is disposed in the receiving groove, the reflective sidewall is in contact with a sidewall of the receiving groove, and the concave structure has a same shape as the receiving groove;

wherein the base layer includes a substrate, a driving circuit layer disposed on the substrate, and a flat layer disposed on the driving circuit layer; the driving circuit layer includes a plurality of driving devices, and the flat layer includes the receiving groove disposed corresponding to the anode.

In an embodiment of the present application, the flat layer is provided with an anode connection hole corresponding to each anode, the driving device is electrically connected to a corresponding anode through the anode connection hole, and a distance from an edge of the receiving groove to the anode connection hole is greater than or equal to 1 um.

In an embodiment of the present application, a depth H of the concave structure satisfies: $0.1 \text{ um} \leq H \leq 1$ um, and a width $W_0$ of the bottom surface of the concave structure satisfies: $1 \text{ um} \leq W_0 \leq 10$ um.

In an embodiment of the present application, the anode includes at least two concave structures, a distance d1 between edges of the bottom surfaces of adjacent two concave structures satisfies: $d1 > 1$ um, and $2H/\tan \alpha \leq d1$, wherein H is a depth of the concave structure.

In an embodiment of the present application, the concave structure includes a groove, and the groove includes a closing groove or a linear groove;

in a case that the linear groove is provided, a plurality of the linear grooves is provided on the anode, and the plurality of the linear grooves are intersected.

In an embodiment of the present application, an outer contour of the groove is at least partially parallel to an outer contour of a corresponding anode, and the outer contour of the groove is axisymmetric.

In an embodiment of the present application, concave structures on the anodes are of same size, a number of the concave structures on the first anode is greater than a number of the concave structures on the second anode, and the number of the concave structures on the second anode is greater than a number of the concave structures on the third anode.

The present application further provides a mobile terminal including a display panel, wherein the display panel includes:

a base layer; and a light-emitting device layer disposed on the base layer, wherein the light-emitting device layer includes a plurality of first color light-emitting devices, a plurality of second color light-emitting devices, and a plurality of third color light-emitting devices; wherein the light-emitting device layer further includes an anode layer, a pixel definition layer, a light-emitting layer, and a cathode; wherein the anode layer includes a plurality of anodes, the pixel definition layer is provided with a pixel opening corresponding to each of the plurality of anodes, the light-emitting layer is provided in the pixel opening and connected to the anode, and the cathode is provided on the light-emitting layer;

wherein the plurality of anodes include a plurality of first anodes corresponding to the first color light-emitting devices, a plurality of second anodes corresponding to the second color light-emitting devices, and a plurality of third anodes corresponding to the third color light-emitting devices; wherein at least one of the first anodes, one of the second anodes, and one of the third anodes have a concave structure in the pixel opening; and the concave structure includes a reflective sidewall having a slope;

wherein an area of each of the first anodes is greater than an area of each of the second anodes, and the area of the second anode is greater than an area of each of the third anodes;

wherein a ratio of an area of the concave structure on the first anode to the area of the first anode is less than a ratio of an area of the concave structure on the second anode to the area of the second anode; and a ratio of an area of the concave structure on the second anode to the area of the second anode is less than a ratio of an area of the concave structure on the third anode to the area of the third anode.

In an embodiment of the present application, a total area of concave structures on the first anode is greater than a total area of concave structures on the second anode, and a total area of concave structures on the second anode is greater than a total area of concave structure on the third anode.

In an embodiment of the present application, the concave structure includes a bottom surface, the reflective sidewall is connected to an edge of the bottom surface, and an acute angle $\alpha$ between the reflective sidewall and the bottom surface satisfies: $10° \leq \alpha \leq 80°$.

In an embodiment of the present application, the base layer is provided with a receiving groove, the concave structure is disposed in the receiving groove, the reflective sidewall is in contact with a sidewall of the receiving groove, and the concave structure has a same shape as the receiving groove;

wherein the base layer includes a substrate, a driving circuit layer disposed on the substrate, and a flat layer disposed on the driving circuit layer; the driving circuit layer includes a plurality of driving devices, and the flat layer includes the receiving groove disposed corresponding to the anode.

In an embodiment of the present application, the flat layer is provided with an anode connection hole corresponding to each anode, the driving device is electrically connected to a corresponding anode through the anode connection hole, and a distance from an edge of the receiving groove to the anode connection hole is greater than or equal to 1 um.

In an embodiment of the present application, a depth H of the concave structure satisfies: $0.1\ um \leq H \leq 1\ um$, and a width $W_0$ of the bottom surface of the concave structure satisfies: $1\ um \leq W_0 \leq 10\ um$.

In an embodiment of the present application, the anode includes at least two concave structures, a distance d1 between edges of the bottom surfaces of adjacent two concave structures satisfies: $d1 > 1\ um$, and $2H/\tan\ \alpha \leq d1$, wherein H is a depth of the concave structure.

In an embodiment of the present application, the concave structure includes a groove, and the groove includes a closing groove or a linear groove;

in a case that the linear groove is provided, a plurality of the linear grooves is provided on the anode, and the plurality of the linear grooves are intersected.

In an embodiment of the present application, an outer contour of the groove is at least partially parallel to an outer contour of a corresponding anode, and the outer contour of the groove is axisymmetric.

In an embodiment of the present application, concave structures on the anodes are of same size, a number of the concave structures on the first anode is greater than a number of the concave structures on the second anode, and the number of the concave structures on the second anode is greater than a number of the concave structures on the third anode.

Beneficial Effect

The present application includes a display panel including a base layer and a light-emitting device layer stacked, wherein the light-emitting device layer includes a plurality of first color light-emitting devices, a plurality of second color light-emitting devices, and a plurality of third color light-emitting devices; the light-emitting device layer includes an anode layer, a pixel definition layer, a light-emitting layer, and a cathode; wherein the anode layer includes a plurality of anodes, the pixel definition layer is provided with a plurality of pixel openings, the pixel openings are provided with the anodes in a one-to-one correspondence to expose part of the anodes, the light-emitting layer is provided in the pixel opening, the light-emitting layer is connected to the anode in the pixel openings, and the cathode is disposed on the light-emitting layer, to emit lights from the light-emitting devices of different colors. The plurality of the anodes includes a plurality of first anodes corresponding to the first color light-emitting devices, a plurality of second anodes corresponding to the second color light-emitting devices, and a plurality of third anodes corresponding to the third color light-emitting devices. An area of each of the first anodes is greater than an area of each of the second anodes, and the area of the second anode is greater than an area of each of the third anodes.

In the pixel opening, at least one first anode, at least one second anode, and at least one third anode are each provided with a concave structure, and the concave structure includes a reflective sidewall having a slope, and the reflective sidewall can reflect a part of the lateral lights emitted from the light-emitting atoms. As such, the lateral lights reflected by the reflective sidewall can be emitted forward as the forward lights, thereby realizing reuse of the lateral lights, improving the light-emitting efficiency of the display panel and reducing the consumption on the display of the display panel, provided that the lateral lights are remain. A ratio of an area of the concave structure on the first anode to the area of the first anode is less than a ratio of an area of the concave structure on the second anode to the area of the second anode; and a ratio of an area of the concave structure on the second anode to the area of the second anode is less than a ratio of an area of the concave structure on the third anode to the area of the third anode, to balance the light-emitting efficiency and the surface flatness of the anode. Thus, the light emitted from different color light-emitting devices on the display panel is more balanced, the white balance of the light-emitting picture is ensured, the display effect of the display panel is improved, and the service life of the display panel is prolonged.

BRIEF DESCRIPTION OF THE DRAWINGS

In order that the technical solution in the embodiments of the present application may be explained more clearly, reference is now being made briefly to the accompanying drawings required for description. It should be understood that the accompanying drawings in the following description are merely some of the embodiments of the present application, and other drawings may be made to those skilled in the art without involving any inventive effort.

FIG. 7 is a top view of a display panel according to another embodiment of the present application;

FIG. 8 is a cross-sectional view of a film layer of a light-emitting device in a display panel according to an embodiment of the present application;

FIG. 9 is a cross-sectional view of a film layer of a light-emitting device in another display panel according to an embodiment of the present application;

FIG. 10 is a cross-sectional view of a film layer of a light-emitting device in another display panel according to an embodiment of the present application;

Figure 1A:
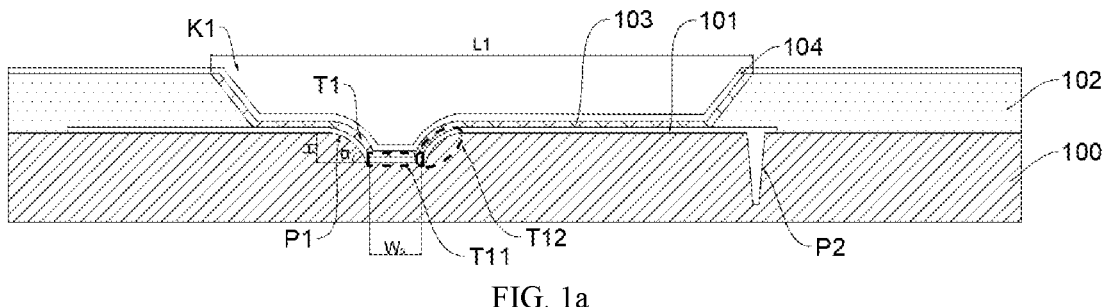
FIG. 1$a$ is a partial schematic structural diagram of a display panel according to an embodiment of the present application.
FIG. 1B is a schematic diagram of a film structure of a display panel according to an embodiment of the present application.

REFERENCE NUMERALS base layer—100, anode—101, effective anode—1001, pixel definition layer—102, light-emitting layer—103, cathode—104, pixel opening—K1, concave structure—T1, reflective sidewall—T12, bottom surface—T11, receiving groove—P1, anode connection hole—P2, pixel opening diameter L1, concave structure bottom surface width $W_0$, concave structure depth H, acute angle α between reflective sidewall and bottom surface, forward light—SL, lateral light—BL, first color light-emitting device—201, second color light-emitting device—202, third color light-emitting device—203, first anode—201$a$, second anode—202$a$, third anode—203$a$; substrate—1001, driving circuit layer—1002, flat layer—1003, and driving device—10021.

DETAILED DESCRIPTION OF THE EMBODIMENTS

In the following, the technical solutions in the embodiments of the present application will be clearly and completely described in connection with the accompanying drawings in the embodiments of the present application. It should be understood that the described embodiments are merely a part of the embodiments of the present application, rather than all the embodiments. Based on the embodiments in the present application, other embodiments obtained by a person skilled in the art without involving any inventive effort are in the scope of the present application.

The embodiment of the application provides a display panel and a mobile terminal. Detailed descriptions are given below. It should be noted that the order in which the following examples are described is not intended to limit the preferred order of the examples. Additionally, in the description herein, the term "including" means "including, but not limited to" The terms first, second, third, and the like are used merely as indications and do not impose numerical requirements or order of establishment. Various embodiments of the present application may provide a range. It should be understood that the description for the range is merely for convenience and brevity, and should not be construed as a hard limitation on the scope of the application. Accordingly, it should be considered that the range has specifically disclosed all possible subranges, as well as a single numerical value in that range. For example, it should be considered that a range from 1 to 6 includes specifically disclosed subranges, e.g., from 1 to 3, from 1 to 4, from 1 to 5, from 2 to 4, from 2 to 6, from 3 to 6, etc., and a single number in the range, e.g., 1, 2, 3, 4, 5, and 6. This is applicable regardless of the range. Additionally, whenever a range of values is indicated herein, it is meant to include any recited value (fractional or integer) in the indicated range.

The display panel with relatively low power consumption is a tendency in related art. The conventional low power consumption of the display panel is generally improved by modifying the driving device or the structure of the display module, and the light-emitting layer process of the OLED is rarely improved. Thus, the power consumption reduction of the OLED has a bottleneck, and the overall light-emitting rate of the display panel is low.

Figure 12:
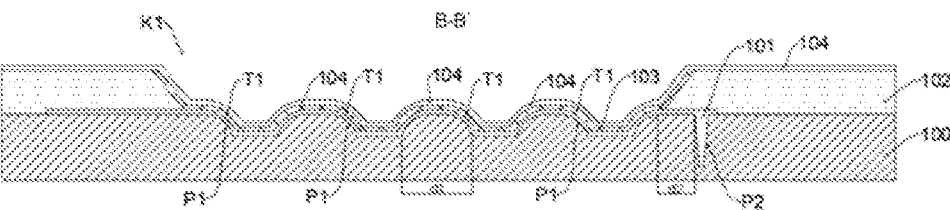
FIG. 12 is a cross-sectional view taken along line B-B' in FIG. 6 or FIG. 7.

In order to improve the light-emitting efficiency of the display panel, reduce the display power consumption of the display panel, and prolong service life of the display panel, the present application provides the following technical solution, specifically referring to FIG. 1$a$-FIG. 12.

Figure 4:
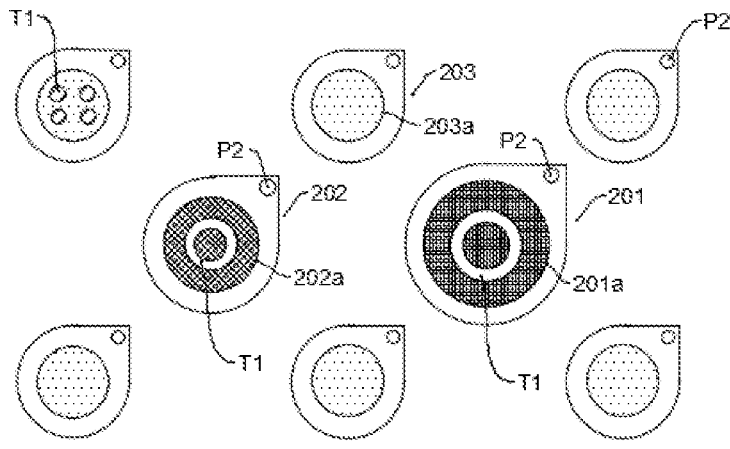
FIG. 4 is a top view of another display panel light-emitting device layer according to an embodiment of the present application.

An embodiment of the present application provides a display panel. Specifically, referring to FIG. 1$a$ to FIG. 12, the display panel includes:

a base layer 100;

a light-emitting device layer disposed on the base layer 100, wherein the light-emitting device layer includes a plurality of first color light-emitting devices 201, a plurality of second color light-emitting devices 202, and a plurality of third color light-emitting devices 203; the light-emitting device layer further includes an anode layer including a plurality of anodes 101, a pixel definition layer 102, a light-emitting layer 103, and a cathode 104; the pixel defining layer is provided with a pixel opening K1 corresponding to each of the anodes, the light-emitting layer 103 is provided in the pixel opening K1 and is connected to the anode 101, and the cathode 104 is provided on the light-emitting layer 103;

wherein the plurality of anodes 101 includes a plurality of first anodes 201a corresponding to the plurality of first color light-emitting devices 201, a plurality of second anodes 202a corresponding to the plurality of second color light-emitting devices 202, and a plurality of third anodes 203a corresponding to the plurality of third color light-emitting devices 203; wherein in the pixel opening K1, at least one of the first anodes 201a, at least one of the second anodes 202a, and at least one of the third anodes 203a each have a concave structure T1; and the concave structure T1 includes a slope-shaped reflective sidewall T12;

an area of each of the first anodes 201a is greater than an area of each of the second anodes 202a, and the area of each of the second anodes 202a is greater than an area of each of the third anodes 203a;

as shown in FIG. 4, in the plurality of anodes 101 having the concave structures T1, a ratio of an area of the concave structure T1 on the first anode 201a to an area of the first anode 201a is less than a ratio of an area of the concave structure T1 on the second anode 202a to an area of the second anode 202a; and the ratio of an area of the concave structure T1 the second anode 202a to an area of the second anode 202a is less than a ratio of an area of the concave structure T1 on the third anode 203a to an area of the third anode 203a.

It should be noted that the structure of the anode 101 has a great influence on the stability of the light-emitting device, the service life of the light-emitting device, and the display effect of the display panel. Although the provision of the concave structure T1 on the anode 101 can improve the light-emitting efficiency, the concave-convex structure is also formed on the surface of the anode 101 due to the manufacturing process of the concave structure T1 to provide a poor contact between the light-emitting layer 103 and the anode 101. In order to balance the light-emitting efficiency, the stability of the light-emitting device, and the service life of the light-emitting device, the technical solution of the present embodiment is provided.

Figure 1B:
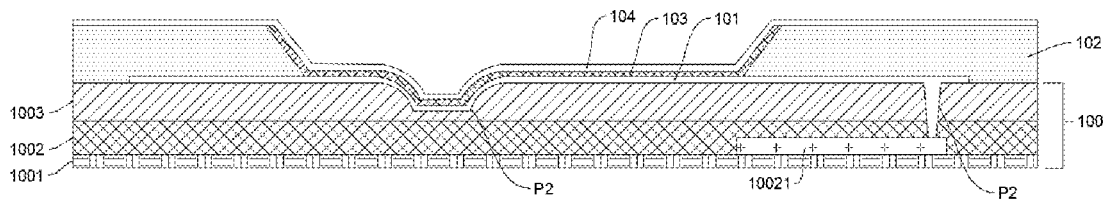

Specifically, as shown in FIG. 1B, the base layer 100 may include a combination of a substrate 1001 of a display panel and a driving circuit layer 1002, and the driving circuit layer 1002 is provided with a flat layer 1003 on a side close to the light-emitting layer 103. The material of the flat layer 1003 may be an organic polymer. The material of the substrate 1001 may be glass or transparent ceramic or transparent plastic or various flexible or flexible materials. For example, polymer resins such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC) or cellulose acetate propionate (CAP).

As shown in FIG. 1B, the driving circuit layer 1002 may be an array substrate layer in this embodiment, and the array substrate layer includes a plurality of driving devices 10021. The driving device 10021 may be a thin film transistor connected to the light-emitting device and controlling the light-emitting device on the light-emitting layer 103 to emit lights.

Specifically, the light-emitting device layer includes a pixel definition layer 102 on which a plurality of pixel openings K1 are provided, and the pixel openings K1 may have the same or different diameters which may be specifically adjusted according to actual production conditions and is not limited herein. The material of the pixel definition layer 102 includes, but is not limited to, photocurable adhesive.

Specifically, the light-emitting device layer further includes an anode layer including a plurality of anodes 101, the plurality of anodes 101 are disposed in same layer and spaced apart, and one anode 101 corresponding to one light-emitting device.

Specifically, in this embodiment, the first color light-emitting device 201 is a blue light-emitting device, the second color light-emitting device 202 is a red light-emitting device, and the third color light-emitting device 203 is a green light-emitting device.

Specifically, as shown in FIG. 1a, the pixel definition layer 102 is disposed on the anode layer, and one pixel opening K1 is disposed corresponding to one anode 101, and the outline shape of the pixel opening K1 is consistent with the shape of the corresponding anode 101. The material of the anode 101 is a conductive material having high reflection performance, and may specifically include a metal, an alloy, a metal oxide, or other conductive material such as silver, titanium, aluminum, or the like.

Specifically, as shown in FIG. 1a, the anode 101 in the pixel opening K1 is provided with a light-emitting layer 103, the material of the light-emitting layer 103 is an organic light-emitting material, and the pixel opening K1 has a diameter L1.

Specifically, as shown in FIG. 1a, the light-emitting layer 103 is provided with a cathode 104, the material of the cathode 104 includes, but is not limited to, a metal, a metal oxide, and a transparent conductive material.

Figure 2:
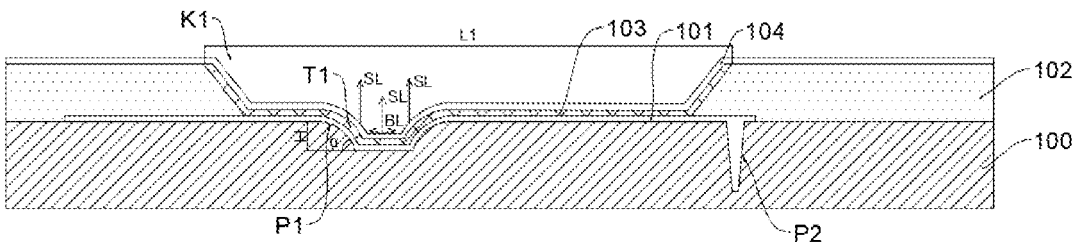
FIG. 2 is a light-emitting schematic diagram of a display panel according to an embodiment of the present application.

It should be noted that, as shown in FIG. 2, the lights emitted by light-emitting atoms of the light-emitting layer 103 has a plurality of orientations, and a part of the light-emitting atoms of the light-emitting layer 103 emits more lights in the horizontal direction (but not all light-emitting atoms emit lights in the horizontal direction). The lights emitted by the light-emitting atoms of the light-emitting layer 103 includes forward lights SL and a part of the lateral lights BL under action of charge injection and recombination. In a conventional light-emitting device structure, the lateral lights BL are continuously reflected to form a waveguide mode, resulted in emitting forward, which reduces the light emission coupling efficiency and remains only 20% of the lights emitted by the light-emitting layer 103 available.

In order to further improve the light-emitting effect, the anode 101 of the present example is provided with a concave structure T1, and the concave structure T1 is provided with a reflective sidewall T12. On basis of light-emitting atoms providing forward lights SL, a part of the lateral lights BL is reflected by the reflective sidewall T12 to emit forward as the forward lights SL. As such, the lights of the part of the lateral lights BL are further utilized, thereby improving the light-emitting efficiency of the light-emitting layer 103.

Specifically, the concave structure T1 may be a groove including a bottom surface T11. The reflective sidewall T12 is connected to the bottom surface T11 as an inner sidewall of the groove, and the reflective sidewall T12 has a high reflectivity.

Specifically, the concave structure T1 includes a slope-shaped reflective sidewall T12, and "slope-shaped" means that the reflective sidewall T12 as a whole has a certain inclined angle with respect to the bottom surface T11 (or with respect to a horizontal plane). The included angle may be an acute angle α between the reflective sidewall T12 and the bottom surface T11 ranging from 0 to 90°, excluding the end value. Due to the thickness of the anode layer and the size limitation of the pixel opening K1, the included angle ranges preferably from 10° to 80°, further from 20° to 60°, and further is 45°.

Specifically, in the concave structure T1 on the anode 101 described in the present application, the reflective sidewall T12 is not limited in shape or specific structure, and structures capable of reflecting the lateral lights BL are in the protection scope of the present application.

Specifically, the peripheral portion of the anode 101 in the anode layer partially overlaps with the opening edge portion of the pixel opening K1 in the pixel defining layer 102. The base layer 100 is provided with an anode connection hole P2, the anode 101 is extended partially through the anode connection hole P2 to electrically connect with the driving device 10021, and the portion of the anode 101 exposed from the pixel opening is an effective anode 1011.

Specifically, the light-emitting layer 103 is disposed in the pixel opening K1, and the light-emitting layer 103 is in close contact with the anode 101 (specifically, the effective anode 1011) in the pixel opening K1 and the sidewall of the pixel opening K1.

Specifically, the light-emitting layer 103 is an evaporated organic material including a hole-transporting layer, a functional layer, a light-emitting layer 103, and an electron-transporting and electron-injecting layer laminated.

Specifically, a cathode 104 is provided on the light-emitting layer 103. The cathode 104 may be provided as a whole, that is, the cathode 104 covers the pixel-definition layer 102 and the light-emitting layer 103.

Specifically, all of the first color light-emitting devices 201 may have the concave structure T1, or some of the first color light-emitting devices 201 may have the concave structure T1.

Specifically, all of the second color light-emitting devices 202 may have the concave structure T1, or some of the second color light-emitting devices 202 may have the concave structure T1.

Specifically, all of the third color light-emitting devices 203 may have the concave structure T1, or some of the third color light-emitting devices 203 may have the concave structure T1.

Specifically, a ratio of an area of the concave structure T1 on the first anode 201a to an area of the first anode 201a is less than a ratio of an area of the concave structure T1 on the second anode 202a to an area of the second anode 202a, and the ratio of the area of the concave structure T1 on the second anode 202a to the area of the second anode 202a is less than a ratio of an area of the concave structure T1 on the third anode 203a to an area of the third anode 203a. As such, the surface of the first anode 201a provided with the concave structure T1 has a higher flatness with respect to the surface of the second anode 202a provided with the concave structure T1 and the surface of the third anode 203a. Thus, the anode 101 of the blue light-emitting device is in close contact with the light-emitting layer 103, the service life of the blue light-emitting device is effectively prolonged, the defect that the service life of the blue light-emitting device is shorter than the service life of the other color light-emitting devices is compensated, the overall life of the display panel is prolonged, and the overall light-emitting efficiency of the display panel is higher.

It should be understood that the display panel in the present application includes a base layer 100 and a light-emitting device layer stacked; the light-emitting device layer includes an anode layer including a plurality of anodes 101, a pixel definition layer 102, a light-emitting layer 103 and a cathode 104; the definition layer 102 is disposed on the anode layer and provided with a plurality of pixel openings K1; the plurality of pixel openings K1 is disposed in one-to-one correspondence to the plurality of anodes 101 to expose portion of the anodes 101; the light-emitting layer 103 is disposed in the pixel opening K1 and is connected to the anode 101 in the pixel opening K1; the cathode 104 is disposed on the light-emitting layer 103; in the pixel opening K1, at least one of the anodes 101 is provided with a concave structure T1; the concave structure T1 includes a reflective sidewall T12 having a slope shape, and the reflective sidewall T12 can reflect a part of the lateral lights BL from the light-emitting atoms; as such, the lateral lights BL can be reflected by the reflective sidewall T12 to emit in the forward lights SL, thereby reuse of the lights from the lateral lights BL, effectively improving the light-emitting efficiency of the display panel, reducing the display power consumption of the display panel, and prolonging the life of the display panel.

Meanwhile, by differentially adjusting the arrangement of the concave structures on the different color light-emitting devices, a ratio of an area of the concave structure T1 on the first color light-emitting device 201 to an area of the first color light-emitting device 201 is less than a ratio of an area of the concave structure T1 on the second color light-emitting device 202 to an area of the second color light-emitting device 202, and the ratio of the area of the concave structure T1 on the red light-emitting device to the area of the red light-emitting device is greater than a ratio of an area of the concave structure T1 on the green light-emitting device to an area of the green light-emitting device. As such, the anode of the blue light-emitting device has a greater flatness on the upper surface than the red light-emitting device and the green light-emitting device. Thus, the display of the light-emitting device is more stable, and the service life is longer. Further, the service life of the display panel is effectively prolonged while improving the light-emitting efficiency of the white lights of the whole display panel.

In an embodiment, the total area of the concave structures T1 on the first anode 201a is greater than the total area of the concave structures T1 on the second anode 202a, and the total area of the concave structures T1 on the second anode 202a is greater than the total area of the concave structures T1 on the third anode 203a.

It should be noted that, as shown in FIG. 3 to FIG. 7, in an example, the life service and the light-emitting efficiency of the blue light-emitting device are generally shorter than the red light-emitting device and the green light-emitting device. In order to further improve the light-emitting efficiency of the display panel, balance the display effect, and improve the service life of the display panel, the area of the blue light-emitting device is generally greater than the area of the red light-emitting device, and the area of the blue light-emitting device is greater than the area of the green light-emitting device; alternatively, the area of the blue light-emitting device is greater than the area of the red light-emitting device, and the area of the red light-emitting device is greater than the area of the green light-emitting device.

For the above, as shown in FIG. 2, it is therefore necessary to provide the total area of the concave structures T1 on all the first color light-emitting devices 201 greater than the total area of the concave structures T1 on all the second color light-emitting devices 202, and greater than the total area of the concave structures T1 on all the third color light-emitting devices 203. As such, the light-emitting efficiency of the blue light-emitting device corresponding to the first color light-emitting device 201 can be greater than the light-emitting efficiency of the red light-emitting device corresponding to the second color light-emitting device 202, and greater than the light-emitting efficiency of the green color light-emitting device corresponding to the third color light-emitting device 203, to synchronously improve the light-emitting efficiency of the whole display panel.

Specifically, as shown in FIG. 3, FIG. 5, FIG. 6, and FIG. 7, the number of the second color light-emitting devices 202 provided with the concave structures T1, the number of the first color light-emitting devices 201 provided with the concave structures T1, and the number of the third color light-emitting devices 203 provided with the concave structures T1 may be different. Specifically, the number of the second color light-emitting devices 202 provided with the concave structures T1 may be adjusted according to actual condition, but the total area of the concave structures T1 on all first color light-emitting devices 201 may be greater than the total area of the concave structures T1 on all second color light-emitting devices 202 and greater than the total area of the concave structures T1 on all third color light-emitting devices 203. As such, the light-emitting efficiency of the blue light-emitting device corresponding to the first color light-emitting device 201 may be greater than the light-emitting efficiency of the red light-emitting device corresponding to the second color light-emitting device 202, and greater than the light-emitting efficiency of the green color light-emitting device corresponding to the third color light-emitting device 203, to improve the light-emitting efficiency of the whole display panel, and avoid the influence of the display effect due to material of the blue light-emitting device.

Specifically, the total area of the concave structures T1 refers to the sum of the areas of the concave structures T1 on all light-emitting devices of the color in the display panel in the direction perpendicular to the base layer 100.

In the actual production process, in a case that the concave structure T1 is a groove, the area of the concave structure T1 may refer to the area of the bottom surface T11 of the groove. and in the direction perpendicular to the base layer 100, the orthographic projection of the reflective sidewall T12 is negligible and effects less.

In an example, the shapes of the concave structures on the first anode 201a, the second anode 202a, and the third anode 203a are not limited, and the sizes of the concave structures T1 on the different anodes 101 are generally the same for convenience of processing.

In an example, the sizes of the concave structures on the first anode 201a, the second anode 202a, and the third anode 203a may be different. For example, in a case that the concave structure is a bar-shaped groove, the widths of the grooves on the different anodes 101 may be provided differently to ensure that the color light-emitting devices have greater light-emitting efficiency respectively.

It should be understood that the total area of the concave structures T1 on the first anode 201a is greater than the total area of the concave structures T1 on the second anode 202a, and the total area of the concave structures T1 on the second anode 202a is greater than the total area of the concave structures T1 on the third anode 203a. For light-emitting devices of different colors, the concave structures T1 are provided differently corresponding to the anodes 101, so that the light-emitting efficiency of the blue light-emitting device of the display panel is increased more. As such, the light-emitting efficiency of the blue light-emitting device of the display panel is significantly enhanced, the service life of the blue light-emitting device is prolonged, and the service life of the display panel is further prolonged.

In an embodiment, the concave structures on the anodes have the same size, the number of the concave structures on the first color light-emitting device is greater than the number of the concave structures on the second color light-emitting device, and the number of the concave structures on the second color light-emitting device is greater than the number of the concave structures on the third color light-emitting device.

Specifically, in the present embodiment, the concave structures T1 on different light-emitting devices has the same size. The same size means that, in a case that the concave structures T1 are closed grooves, the grooves have the same in the depths, the inclined angles of the reflective sidewalls T12, and the shapes (or outer contour) of the bottom surfaces T11. In a case that the concave structure T1 is a linear groove, the grooves have the same in the depths, the inclined angle of the reflective sidewalls T12, and the shortest distance (or the width of the groove) between the two oppositely disposed reflective sidewalls T12.

Figure 6:
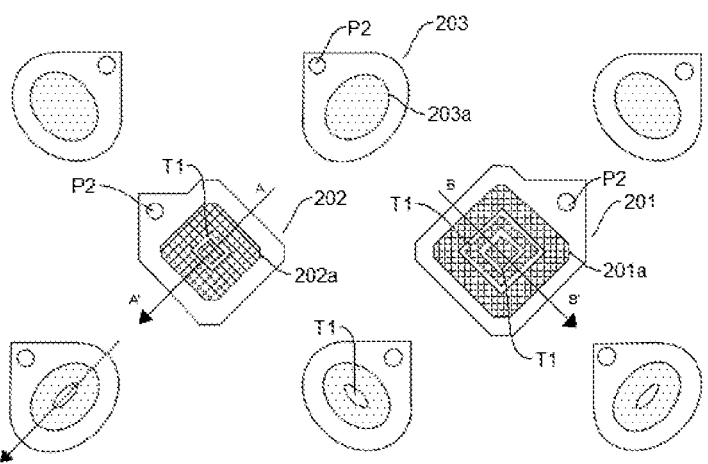
FIG. 6 is a top view of a display panel according to another embodiment of the present application.
Figure 11:
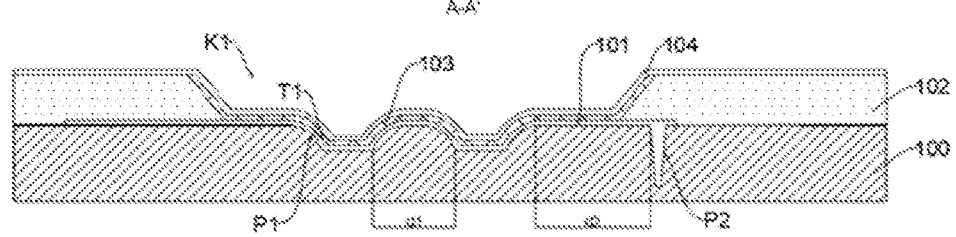
FIG. 11 is a cross-sectional view taken along line A-A' in FIG. 6 or FIG. 7.

It should be noted that FIG. 11 may be a cross-sectional view taken along line A-A' in FIG. 6 or FIG. 7, and FIG. 12 may be a cross-sectional view taken along line B-B' in FIG. 6 or FIG. 7.

In a specific example, as shown in FIG. 7, in a case that the light-emitting device is circular, the outer contour of the concave structure T1 is circular, wherein the third color light-emitting device 203 is provided with a closed groove, the red light-emitting device is provided with an annular groove, and the blue light-emitting device is provided with two concentric annular grooves.

Figure 5:
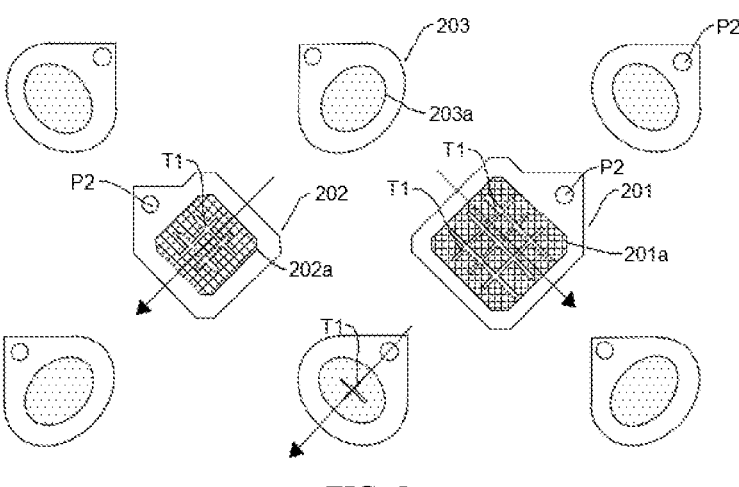
FIG. 5 is a top view of a display panel according to another embodiment of the present application.

In a specific example, as shown in FIG. 5, in a case that the light-emitting device is square/elliptical, the green light-emitting device may not be provided with a concave structure T1. The green light-emitting device may be provided with a cross-shaped and strip-shaped groove, and the red light-emitting device may be provided with a well-shaped groove (that is, two line-shaped grooves are intersected with two line-shaped grooves in the XY direction), and the blue light-emitting device may be provided with a plurality of strip-shaped grooves to intersect to define a grid shape (that is, three line-shaped grooves are intersected with three line-shaped grooves in the XY direction).

In a specific example, as shown in FIG. 6, in a case that the light-emitting device is square/elliptical, the green light-emitting device may not be provided with a concave structure T1. The green light-emitting device may be provided with an elliptical closed groove, the red light-emitting device may be provided with a square annular groove, and the blue light-emitting device may be provided with a rectangular-ambulatory-plane groove (that is, two concentric square annular grooves).

It should be noted that, except for the above-described embodiment, in a case that the light-emitting device is provided in a polygonal structure, for example, from a quadrangle to an octagon or an N-shape, the shape of the concave structure T1 changes accordingly to ensure each side of the concave structure T1 is parallel to the side of the corresponding light-emitting device, and the shape of the concave structure T1 has symmetry in at least one direction. According to the technical scheme, the viewing angle of light emission of the OLED display panel can have symmetry, and a poor optical performance is avoided.

In an embodiment, the concave structure T1 includes a bottom surface T11, and the reflective sidewall T12 is connected to an edge of the bottom surface T11. An acute angle between the reflective sidewall T12 and the base layer 100 is a, and the acute angle $\alpha$ satisfies: $10° \leq \alpha \leq 80°$.

Specifically, the concave structure T1 includes a bottom surface T11 having a flat surface, and the light-emitting layer 103 in the pixel opening K1 is provided in close contact with the anode 101 in the pixel opening K1 and the sidewall of the pixel opening K1.

Specifically, in order to improve the color, shift on viewing angle of the display panel, the inclined angle of the reflective sidewall T12 is further limited.

Specifically, in the direction perpendicular to the base layer 100, the outer contour shape of the concave structure T1 is different, and the shape of the bottom surface T11 is also different. The outer contour of the bottom surface T11 is preferably the same as the outer contour of the corresponding light-emitting device on the light-emitting device layer, and may be circular, circular, rectangular, or other regular or irregular patterns.

It should be understood that by further limiting the range of the acute angle $\alpha$ between the reflective sidewall T12 and the first layer to 10°-80°, the amount of the lateral lights BL is increased, so that the color shift of the display panel is further improved.

Figure 3:
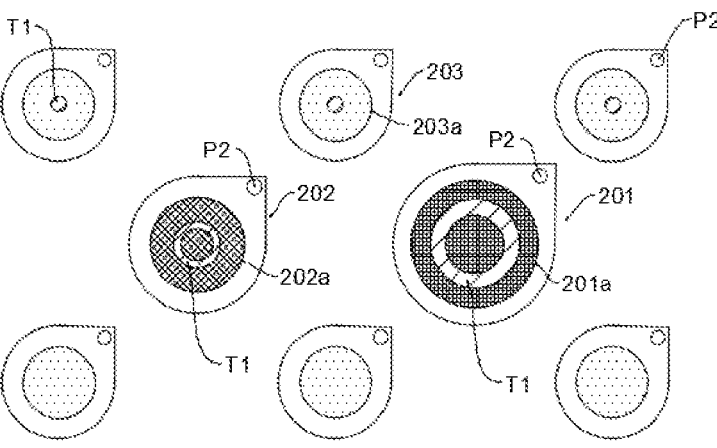
FIG. 3 is a top view of a light-emitting device layer in a display panel according to an embodiment of the present application.

In an example, as shown in FIGS. 2 to 4, the bottom surface T11 of the concave structure T1 has flat surface, and the reflective sidewall T12 has flat slope or an arc slope.

Specifically, the bottom surface T11 is flat in order to improve the light-emitting effect of the light-emitting atoms.

It should be noted that the lights emitted by the light-emitting atoms (only referring to the light-emitting atom providing the forward light SL) are intense at the forward (that is, the lights are lenticular to the emitting surface at an angle of 0 degree.) is the strongest. As the viewing angle increases, the intensity of the lights decays, and the unflatness of the bottom surface T11 affects the forward light SL emitted from the light-emitting atoms.

According to the preferred embodiment, the convex slope surface is provided with the reflective sidewall T12, so that the lateral lights BL emitted from the light-emitting atoms are reflected at a large angle as far as possible, and the light-emitting mode of the light-emitting atoms in the light-emitting layer 103 on the reflective sidewall T12 is not affected. As such, the viewing angle range can be further increased compared with the reflective sidewall T12 with the flat slope and the concave slope.

In an embodiment, as shown in FIG. 1a, the base layer 100 is provided with a receiving groove P1, the concave structure T1 is located in the receiving groove P1, the reflective sidewall T12 of the concave structure T1 is attached to the sidewall of the receiving groove P1, and the concave structure T1 has the same shape as the receiving groove P1.

The base layer 100 includes a substrate 1001, a driving circuit layer 1002 disposed on the substrate 1001, and a flat layer 1003 disposed on the driving circuit layer 1002. The driving circuit layer 1002 includes a plurality of driving devices 10021, and the receiving groove P1 is disposed on the flat layer 1003, that is, the flat layer includes a receiving groove provided corresponding to an anode.

It should be noted that, in the related art, the thickness of the anode layer is generally limited. As such, even if the concave structure T1 is provided, the slope of the reflective sidewall T12 is long, the inclined angle $\alpha$ is small, the lateral light BL cannot be better reflected, and the light-emitting efficiency is limited.

For the above, by providing the receiving groove P1 on the flat layer 1003 of the base layer 100, the shape and the depth of the receiving groove P1 can be adjusted by matching (by etching the flat layer 1003) in the process according to the size (shape or depth) of the concave structure T1 actually required. After the receiving groove P1 is formed, the anode layer is formed on the base layer 100, and the concave structure T1 is formed on the anode layer at the position corresponding to the receiving groove P1.

It should be appreciated that by providing the receiving groove P1 on the base layer 100, the inclined angle of the reflective sidewall T12 in the concave structure T1 on the anode layer has a greater selectable range, and the process is more convenient. Further, the accuracy requirement is lower relative to the solution of providing the concave structure T1 directly on the anode layer, and the production process is not additionally increased and the production cost is lower.

According to the above embodiments, as shown in FIG. 11 and FIG. 12, the flat layer 1003 is provided with an anode connection hole P2 corresponding to each anode 101, and the distance between the edge of the receiving groove P1 and the anode connection hole P2 is greater than or equal to 1 um.

Specifically, as shown in FIG. 11 or FIG. 12, the edge of the receiving groove P1 is actually an edge of an effective anode 1011 of the light-emitting device, and the distance between the edge of the effective anode 1011 and the anode connection hole P2 is provided greater than or equal to 1 um in order to ensure a better connection between the light-emitting device and the driving device 10021, and to avoid poor display of the light-emitting device due to accuracy error of punching in the manufacturing process. Specifically, the distance may be 1 um, 3 um, 5 um, and the like.

Accordingly, in an example, the shortest distance from the concave structure T1 on the light-emitting device to the corresponding inner edge of the pixel opening K1 is a boundary distance. The boundary distance of the concave structure T1 on the first color light-emitting device 201 is less than the boundary distance of the concave structure T1 on the second color light-emitting device 202, and the boundary distance of the concave structure T1 on the second color light-emitting device 202 is less than the boundary distance of the concave structure T1 on the third color light-emitting device 203.

According to the above embodiment, as shown in FIG. 1a, the depth H of the concave structure T1 satisfies: 0.1 um$\leq$H$\leq$1 um, and the width Woof the bottom surface T11 satisfies: 1 um$\leq W_0 \leq$10 um.

Specifically, the depth H of the concave structure T1 may be any one of 0.1 um, 0.2 um, 0.3 um, 0.5 um, 0.7 um, 0.9 um, and 1.0 um, and may be adjusted according to actual production condition.

In an embodiment, as shown in FIG. 11 and FIG. 12, the anode 101 includes at least two concave structures T1, and a spacing d1 between the edges of the bottom surfaces T11 of the two adjacent concave structures T1 is defined. The spacing d1 satisfies: d1>1 um, and 2H/tan $\alpha \leq$d1, wherein H represents the depth of the concave structure T1.

Specifically, d1 is a minimum value of the spacing between the edges of the bottom surfaces T11 of the two adjacent concave structures T1.

Specifically, in order to improve the light-emitting efficiency of the light-emitting device as much as possible, at a certain stage with the inclined angle is constant, the light-emitting efficiency of the light-emitting device is positively related to the area of the reflective sidewall T12. The plurality of the anodes 101 are provided to include at least two concave structures T1.

It should be appreciated that the anode 101 is provided with a plurality of concave structures T1, so that the area of the reflective sidewall T12 can be increased to a certain extent, which improves the light-emitting efficiency of the light-emitting device.

In an embodiment, the anode 101 includes at least one concave structure T1 with a groove, and the groove includes a closed groove or a linear groove.

Specifically, the concave structure T1 includes a bottom surface T11 and a reflective sidewall T12. The bottom surface T11 of the closed groove has a planar pattern, such as a circle, an ellipse, a rectangle, and the like, and the bottom surface T11 of the linear groove has an elongated shape having an extension direction that may be parallel to the edge of the anode 101.

Specifically, a plurality of concave structures T1, preferably not more than four, may be provided on one of the anodes 101 corresponding to one of the light-emitting devices. Specifically, the concave structures T1 are adjusted according to the size, and the accuracy of the process.

Specifically, the groove may have a variety of shapes, and the cross-sectional shape of the groove includes, but is not limited to, axisymmetric polygon, inverted trapezoid, semi-arc, and the like.

Further, the elongated shape may be a straight elongated strip or a curved elongated annular groove, such as the groove on the first anode 201a and the second anode 202a in FIG. 6 and FIG. 7. For example, the shape of the groove may be circle, and rectangular-ambulatory plane.

Specifically, the closed groove refers to a groove in which the bottom surface T11 is a closed pattern. For example, the groove on the third anode 203a in FIGS. 5 to 7 is any one of a circle, an ellipse, and a rectangle.

The present application does not limit the shape of the concave structure T1, and can be adjusted according to actual production condition and requirement.

In an embodiment, the groove is a linear groove, a plurality of the linear grooves is provided on one anode 101, and the plurality of the linear grooves are intersected.

Specifically, as shown in FIG. 5, a well-shaped groove is provided on the second anode 202a, and a plurality of cross-intersected mesh grooves are provided on the first anode 201a.

In an embodiment, as shown in FIGS. 5 to 7, the outer contour of the groove is at least partially parallel to the outer contour of the corresponding anode 101, and the outer contour of the groove is axisymmetric.

Specifically, the light-emitting device layer includes a plurality of light-emitting devices, and each light-emitting device has a corresponding outer contour in a top view, and the outer contour may be circular, rectangular, polygonal, or irregular in shape.

Specifically, the contour shape of the groove means that, in a top view, the outer contour of the groove in the longitudinal direction is the same as the outer contour of the light-emitting device (specifically, the anode 101 and further the effective anode 1011) corresponding thereto. For example, the outer contour of the active anode 1011 is circular, and the pattern enclosed in the groove is also circular. For example, the outer contour of the effective anode 1011 is rectangular, and the pattern enclosed in the groove is also rectangular. Alternatively, the groove is a linear groove parallel to the edge of the effective anode 1011, and the pattern enclosed in the groove is in a well shape.

It should be noted that, in order to ensure the symmetrical viewing angle of the display panel, the shape of the conventional light-emitting device (which can be understood as a sub-pixel) is generally an axisymmetric.

It should be appreciated that in the present embodiment, the shape enclosed by the groove is the same as the shape of the light-emitting device, or the extending direction of the groove is parallel to the corresponding side edge of the light-emitting device, so that the symmetrical viewing angle of the display panel can be effectively improved and the optical performance can be improved.

The present application further provides a mobile terminal including the display panel described in any one of the above.

Specifically, the mobile terminal includes, but is not limited to, the following types: curlable or foldable handsets, watches, wristbands, televisions or other wearable display or touch electronics, and flexible smartphones, tablets, notebooks, desktop displays, televisions, smart glasses, smart watches, ATM machines, digital cameras, on-board displays, medical displays, industrial displays, electronic paper books, electrophoretic displays, gaming machines, transparent displays, two-sided displays, naked-eye 3D displays, mirror display devices, semi-reflective and semi-transmissive display devices, and the like.

As above, the present application includes a base layer 100, and a light-emitting device layer including an anode layer, a pixel definition layer 102, a light-emitting layer 103, and a cathode 104, wherein the anode layer includes a plurality of anodes 101, the pixel definition layer 102 is disposed on the anode layer, a plurality of pixel openings K1 are disposed on the pixel definition layer 102, and the pixel openings K1 are disposed with the anodes 101 in a one-to-one correspondence to expose portions of the anodes 101. The light-emitting layer 103 is disposed in each of the pixel openings K1, the light-emitting layer 103 is connected to each of the anodes 101 in the pixel opening K1, and the cathode 104 is disposed on the light-emitting layer 103. In the pixel opening K1, at least one of the anodes 101 is provided with a concave structure T1. The concave structure T1 includes a reflective sidewall T12 having a slope, and the reflective sidewall T12 can reflect a part of the lateral lights BL emitted by the light-emitting atoms. As such, the part of the lateral lights BL reflected by the reflective sidewall T12 can be emitted toward as the forward lights SL, thereby realizing reuse of the lights emitted from the lateral lights BL, effectively improving the light-emitting efficiency of the display panel, reducing the display power consumption of the display panel, and prolonging the service life of the display panel.

Meanwhile, the total area of the concave structures T1 on the first anodes 201a is greater than the total area of the concave structures T1 on the second anodes 202a, and the total area of the concave structures T1 on the second anodes 202a is greater than the total area of the concave structures T1 on the third anodes 203a. For a light-emitting device of different colors, the concave structures T1 are provided differently corresponding to the anodes 101. As such, the light-emitting efficiency of the blue light-emitting device is increased more, and the light-emitting efficiency of the blue light-emitting device of the display panel is significantly enhanced. Thus, the service life of the blue light-emitting device is prolonged, and the service life of the display panel is further prolonged.

The present invention has been described in detail with reference to a display panel and a mobile terminal according to embodiments of the present application. The principles and embodiments of the present application are described herein using specific examples. The description is merely provided to help understand the method and the core idea of the present application. At the same time, variations will occur to those skilled in the art in both the detailed embodiment and the scope of application in accordance with the teachings of the present application. In view of the foregoing, the present description should not be construed as limiting the application.

The invention claimed is:

1. A display panel, comprising:

a base layer; and a light-emitting device layer disposed on the base layer, wherein the light-emitting device layer comprises a plurality of first color light-emitting devices, a plurality of second color light-emitting devices, and a plurality of third color light-emitting devices; wherein the light-emitting device layer further comprises an anode layer, a pixel definition layer, a light-emitting layer, and a cathode; wherein the anode layer comprises a plurality of anodes, the pixel definition layer is provided with a pixel opening corresponding to each of the plurality of anodes, the light-emitting layer is provided in the pixel opening and connected to the anode, and the cathode is provided on the light-emitting layer;

wherein the plurality of anodes include a plurality of first anodes corresponding to the first color light-emitting devices, a plurality of second anodes corresponding to the second color light-emitting devices, and a plurality of third anodes corresponding to the third color light-emitting devices; wherein at least one of the first anodes, one of the second anodes, and one of the third anodes have a concave structure in the pixel opening; and the concave structure includes a reflective sidewall having a slope;

wherein an area of each of the first anodes is greater than an area of each of the second anodes, and the area of the second anode is greater than an area of each of the third anodes;

wherein a ratio of an area of the concave structure on the first anode to the area of the first anode is less than a ratio of an area of the concave structure on the second anode to the area of the second anode; and a ratio of an area of the concave structure on the second anode to the area of the second anode is less than a ratio of an area of the concave structure on the third anode to the area of the third anode.

2. The display panel of claim 1, wherein a total area of concave structures on the first anode is greater than a total area of concave structures on the second anode, and a total area of concave structures on the second anode is greater than a total area of concave structure on the third anode.

3. The display panel of claim 1, wherein the concave structure comprises a bottom surface, the reflective sidewall is connected to an edge of the bottom surface, and an acute angle $\alpha$ between the reflective sidewall and the bottom surface satisfies: $10° \leq \alpha \leq 80°$.

4. The display panel of claim 3, wherein the base layer is provided with a receiving groove, the concave structure is disposed in the receiving groove, the reflective sidewall is in contact with a sidewall of the receiving groove, and the concave structure has a same shape as the receiving groove; wherein the base layer includes a substrate, a driving circuit layer disposed on the substrate, and a flat layer disposed on the driving circuit layer; the driving circuit layer includes a plurality of driving devices, and the flat layer includes the receiving groove disposed corresponding to the anode.

5. The display panel of claim 4, wherein the flat layer is provided with an anode connection hole corresponding to each anode, the driving device is electrically connected to a corresponding anode through the anode connection hole, and a distance from an edge of the receiving groove to the anode connection hole is greater than or equal to 1 um.

6. The display panel of claim 3, wherein a depth H of the concave structure satisfies: $0.1 \, um \leq H \leq 1 \, um$, and a width $W_0$ of the bottom surface of the concave structure satisfies: $1 \, um \leq W_0 \leq 10 \, um$.

7. The display panel of claim 6, wherein the anode comprises at least two concave structures, a distance d1 between edges of the bottom surfaces of adjacent two concave structures satisfies: $d1 > 1 \, um$, and $2H/\tan \alpha \leq d1$, wherein H is a depth of the concave structure.

8. The display panel of claim 1, wherein the concave structure comprises a groove, and the groove comprises a closing groove or a linear groove;

in a case that the linear groove is provided, a plurality of the linear grooves is provided on the anode, and the plurality of the linear grooves are intersected.

9. The display panel of claim 8, wherein an outer contour of the groove is at least partially parallel to an outer contour of a corresponding anode, and the outer contour of the groove is axisymmetric.

10. The display panel of claim 1, wherein concave structures on the anodes are of same size, a number of the concave structures on the first anode is greater than a number of the concave structures on the second anode, and the number of the concave structures on the second anode is greater than a number of the concave structures on the third anode.

11. A mobile terminal, wherein the mobile terminal comprises a display panel including:

a base layer; and a light-emitting device layer disposed on the base layer, wherein the light-emitting device layer comprises a plurality of first color light-emitting devices, a plurality of second color light-emitting devices, and a plurality of third color light-emitting devices; wherein the light-emitting device layer further comprises an anode layer, a pixel definition layer, a light-emitting layer, and a cathode; wherein the anode layer comprises a plurality of anodes, the pixel definition layer is provided with a pixel opening corresponding to each of the plurality of anodes, the light-emitting layer is provided in the pixel opening and connected to the anode, and the cathode is provided on the light-emitting layer;

wherein the plurality of anodes include a plurality of first anodes corresponding to the first color light-emitting devices, a plurality of second anodes corresponding to the second color light-emitting devices, and a plurality of third anodes corresponding to the third color light-emitting devices; wherein at least one of the first anodes, one of the second anodes, and one of the third anodes have a concave structure in the pixel opening; and the concave structure includes a reflective sidewall having a slope;

wherein an area of each of the first anodes is greater than an area of each of the second anodes, and the area of the second anode is greater than an area of each of the third anodes;

wherein a ratio of an area of the concave structure on the first anode to the area of the first anode is less than a ratio of an area of the concave structure on the second anode to the area of the second anode; and a ratio of an area of the concave structure on the second anode to the area of the second anode is less than a ratio of an area of the concave structure on the third anode to the area of the third anode.

12. The mobile terminal of claim 11, wherein a total area of concave structures on the first anode is greater than a total area of concave structures on the second anode, and a total area of concave structures on the second anode is greater than a total area of concave structure on the third anode.

13. The mobile terminal of claim 11, wherein the concave structure comprises a bottom surface, the reflective sidewall is connected to an edge of the bottom surface, and an acute angle $\alpha$ between the reflective sidewall and the bottom surface satisfies: $10° \leq \alpha \leq 80°$.

14. The mobile terminal of claim 13, wherein the base layer is provided with a receiving groove, the concave structure is disposed in the receiving groove, the reflective sidewall is in contact with a sidewall of the receiving groove, and the concave structure has a same shape as the receiving groove;

wherein the base layer includes a substrate, a driving circuit layer disposed on the substrate, and a flat layer disposed on the driving circuit layer; the driving circuit layer includes a plurality of driving devices, and the flat layer includes the receiving groove disposed corresponding to the anode.

15. The mobile terminal of claim 14, wherein the flat layer is provided with an anode connection hole corresponding to each anode, the driving device is electrically connected to a corresponding anode through the anode connection hole, and a distance from an edge of the receiving groove to the anode connection hole is greater than or equal to 1 um.

16. The mobile terminal of claim 13, wherein a depth H of the concave structure satisfies: $0.1 \text{ um} \leq H \leq 1 \text{ um}$, and a width $W_0$ of the bottom surface of the concave structure satisfies: $1 \text{ um} \leq W_0 \leq 10 \text{ um}$.

17. The mobile terminal of claim 16, wherein the anode comprises at least two concave structures, a distance d1 between edges of the bottom surfaces of adjacent two concave structures satisfies: $d1 > 1 \text{ um}$, and $2H/\tan \alpha \leq d1$, wherein H is a depth of the concave structure.

18. The mobile terminal of claim 11, wherein the concave structure comprises a groove, and the groove comprises a closing groove or a linear groove;

in a case that the linear groove is provided, a plurality of the linear grooves is provided on the anode, and the plurality of the linear grooves are intersected.

19. The mobile terminal of claim 18, wherein an outer contour of the groove is at least partially parallel to an outer contour of a corresponding anode, and the outer contour of the groove is axisymmetric.

20. The mobile terminal of claim 11, wherein concave structures on the anodes are of same size, a number of the concave structures on the first anode is greater than a number of the concave structures on the second anode, and the number of the concave structures on the second anode is greater than a number of the concave structures on the third anode.

\* \* \* \* \*